United States Patent
Yi et al.

(10) Patent No.: US 9,905,282 B1
(45) Date of Patent: Feb. 27, 2018

(54) TOP ELECTRODE DOME FORMATION

(71) Applicant: GLOBALFOUNDRIES Singapore Pte. Ltd., Singapore (SG)

(72) Inventors: Wanbing Yi, Singapore (SG); Curtis Chun-I Hsieh, Singapore (SG); Soh Yun Siah, Singapore (SG); Juan Boon Tan, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/608,407

(22) Filed: May 30, 2017

(51) Int. Cl.
```
G11C 11/15      (2006.01)
G11C 11/16      (2006.01)
H01F 10/32      (2006.01)
H01F 41/30      (2006.01)
H01L 27/22      (2006.01)
H01L 43/12      (2006.01)
```
(52) U.S. Cl.
CPC .......... *G11C 11/16* (2013.01); *H01F 10/3254* (2013.01); *H01F 41/303* (2013.01); *H01L 27/222* (2013.01); *H01L 43/12* (2013.01)

(58) Field of Classification Search
CPC ... G11C 11/16; H01F 10/3254; H01F 41/303; H01L 27/222; H01L 43/12

USPC ....... 365/173, 46, 55, 74, 97, 100, 131, 148, 365/158, 171, 163
See application file for complete search history.

(56) References Cited

U.S. PATENT DOCUMENTS

| | | | |
|---|---|---|---|
| 9,349,772 B2 | 5/2016 | Yi et al. | |
| 9,490,423 B2 | 11/2016 | Tan et al. | |
| 2016/0308119 A1* | 10/2016 | Hsu | H01L 43/08 |
| 2016/0351797 A1 | 12/2016 | Yi et al. | |

* cited by examiner

*Primary Examiner* — Fernando Hidalgo
(74) *Attorney, Agent, or Firm* — Ditthavong & Steiner, P.C.

(57) ABSTRACT

Methods of fabricating a dome-shaped MTJ TE and the resulting devices are provided. Embodiments include forming a MRAM stack having a laterally separated MTJ structures and the MRAM and a logic stack each having a SiN layer; forming first trenches through the MRAM stack to a portion of the SiN layer above an MTJ structure; forming second trenches through the SiN layer fully landing on an upper portion of the MTJ structures and removing the SiN layer of the logic stack; forming a TaN layer over the MRAM and logic stack; removing portions of the TaN layer on opposite sides of the MTJ structures and therebetween; forming an oxide layer over the MRAM and logic stacks; and forming vias through the oxide layer of the MRAM stack down the TaN layer above MTJ structures and a via through the logic stack.

20 Claims, 14 Drawing Sheets

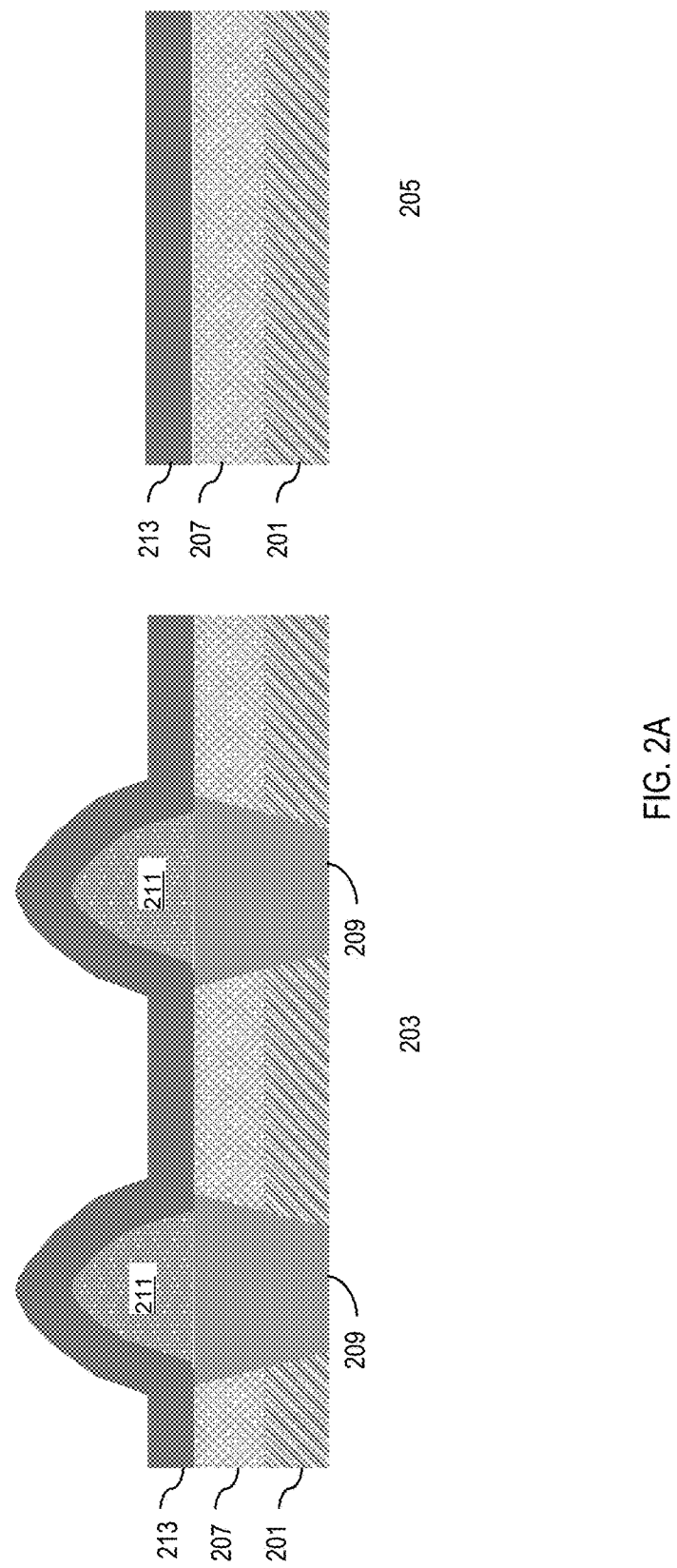

TOP ELECTRODE DOME FORMATION

TECHNICAL FIELD

The present disclosure relates to memory design for semiconductor devices. The present disclosure is particularly applicable to magnetic random-access memory (MRAM) structures in integrated circuit (IC) and methods for fabricating the same.

BACKGROUND

MRAM is rapidly replacing conventional memory. One critical aspect of the MRAM technology development is forming a magnetic tunnel junction (MTJ) structure for MTJ memory devices. However, conventional etching processes may remove and damage a shallow and small top electrode (TE) of a MTJ structure, thereby significantly damaging the operation of a memory device. For example, the critical dimension (CD) of a shallow and small MTJ TE is approximately 40 nanometer (nm); however, the process variation from chemical mechanical planarization (CMP) and etching is more than 40 nm. Therefore, there is no manufacturing process window. In addition, MTJ sidewalls are commonly formed of silicon nitride (SiN), which is low temperature and has lower oxide etch selectivity compared with normal SiN. Consequently, the likelihood of damage to the thin MTJ sidewalls and compromised MTJ performance is significantly increased.

A need therefore exists for methodology enabling fabrication of a MTJ TE that addresses the top connection challenges when the MTJ TE is shallow and small and the resulting device.

SUMMARY

An aspect of the present disclosure is a method of forming a dome-shaped MTJ TE structure.

Another aspect of the present disclosure is a device including a dome-shaped MTJ TE structure.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a MRAM stack and a logic stack of an IC structure, the MRAM stack having a laterally separated MTJ structures and the MRAM and logic stacks each having a SiN layer; forming first trenches through the MRAM stack down through a portion of the SiN layer, each first trench formed above an MTJ structure; forming second trenches through the SiN layer of the MRAM stack, the second trenches fully landed on an upper portion of the MTJ structures and the formation removing the SiN layer of the logic stack; forming a tantalum nitride (TaN) layer over the MRAM and logic stacks; removing portions of the TaN layer on opposite sides of the MTJ structures and therebetween; forming an oxide layer over the MRAM and logic stacks; and forming vias through the oxide layer of the MRAM stack down the TaN layer above each MTJ structure and a via through the logic stack.

Aspects of the present disclosure include forming the MRAM and logic stacks by: forming the passivation layer over an interlayer dielectric (ILD) of the IC structure; forming a trench through the passivation layer down to the ILD, the trench forming a MRAM region and a logic region; forming a first oxide layer over the passivation layer; forming lower interconnect structures laterally separated through the first oxide and passivation layers of the MRAM region; forming a MTJ layer over the first oxide layer of the MRAM region and the lower interconnect structures; etching the MTJ layer down to the first oxide layer and lower interconnect structures, the etching forming a MTJ structure over a center portion of each lower interconnect; forming the SiN layer over the first oxide layer and the MTJ structures; forming a second oxide layer over the SiN layer; forming a near-frictionless carbon (NFC) layer over the second oxide layer; forming a low temperature oxide (LTO) layer over the NFC layer; and forming a photoresist layer over the LTO. Further aspects include forming the SiN layer to a thickness of 10 nm to 40 nm. Another aspect includes forming the first trenches by: forming a trench with a bottom CD of 50 nm to 110 nm through the photoresist layer above each MTJ structure; and etching the LTO, NFC, second oxide, and a portion of the SiN layers through each trench. Further aspects include forming the second trenches by: stripping the photoresist, LTO, and NFC layers; and etching the SiN layer until each second trench has a bottom CD of 30 nm to 90 nm, the etching removing the second oxide layer from the logic stack. Additional aspects include etching the SiN layer includes a fully-landed etch process or a chemical vapor deposition (CVD) film deposition and etch process. Other aspects include comprising forming each dome-shaped TaN layer by: forming the TaN layer to a thickness of 10 nm to 40 nm over the MRAM and logic stacks; etching portions of the TaN layer down to the second oxide layer on opposite sides of each MTJ structure and therebetween with lithography, and consecutively removing the TaN layer from over the logic stack. Additional aspects include dielectric deposition, planarization and interconnect formation in both MRAM and logic regions.

Another aspect of the present disclosure is present disclosure is a device including: a passivation layer over an ILD of a MRAM region and a logic region of an IC structure, the MRAM and logic regions laterally separated; a first oxide layer over the passivation layer; lower interconnect structures laterally separated through the first oxide and passivation layers of the MRAM region; MTJ structures laterally separated, each MTJ structure over a center portion of a lower interconnect; SiN spacers formed around each MTJ structure; a domed-shaped TaN layer over each MTJ structure, the domed-shaped TaN layers laterally separated; a second oxide layer over the MRAM and logic regions; a via through the second oxide layer down to the domed-shaped TaN layer over each MTJ structure; and a via through the logic region down to the ILD. Other aspects include each SiN spacer including a horizontal portion over the first oxide layer and a portion of a lower interconnect structure and the portions over the first oxide layer between the MTJ structures are contiguous.

Aspects of the device include the TaN layer having a thickness of 10 nm to 40 nm. Another aspect includes the second oxide layer having a thickness of 30 nm to 90 nm. Another aspect includes each SiN spacer including a horizontal portion over the first oxide layer and a portion of a lower interconnect structure and the portions over the first oxide layer between the MTJ structures are contiguous. Other aspects include each SiN spacer having a thickness of 10 nm to 40 nm. A further aspect includes the domed-shaped TaN layer having an upper CD of 60 nm to 150 nm.

Additional aspects include a contact area between the domed-shaped TaN layer and the MTJ structure having a CD of 30 nm to 90 nm. A further aspect includes each SiN spacer having a lower portion with a width of 10 nm to 40 nm and a tapered upper portion.

A further aspect of the present disclosure is a method including: forming a MRAM stack and a logic stack of an IC structure, the MRAM stack having MTJ structures and the MRAM and logic stacks each having a SiN layer; etching the SiN layer of the logic stack and portions of the SiN layer of the MRAM stack, the etching forming a SiN spacers around each MTJ structure; forming a conformal TaN layer over the MRAM and logic stacks; removing the TaN layer over the logic stack and portions of the TaN layer between the MTJ structures and leaving the TaN layer covering the MTJ structures un-etched; forming an oxide layer over the MRAM and logic regions; forming a via through the oxide layer down to the TaN layer above each MTJ structure and through the logic stack; and planarizing the oxide layer prior to forming a metal contact layer over the MRAM and logic stacks.

Aspects of the present disclosure include forming the MRAM and logic stacks by: forming a passivation layer over an ILD on the IC structure; forming a trench through the passivation layer down to the ILD, the trench forming a MRAM region and a logic region; forming a first oxide layer over the passivation layer; forming lower interconnect structures laterally separated through the first oxide and passivation layers of the MRAM region; forming a MTJ layer over the lower interconnect structures and the first oxide layer of the MRAM region; etching the MTJ layer down to the first oxide layer and lower interconnect structures, the etching forming a MTJ structure over a center portion of each lower interconnect; and forming the SiN layer over the first oxide layer and the MTJ structures. Another aspect includes forming the SiN layer to a thickness of 10 nm to 40 nm. Additional aspects include forming the TaN layer to a thickness of 10 nm to 40 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 2A through 2F schematically illustrate cross-sectional views of a process flow for forming a dome-shaped MTJ TE structure using a spacer encapsulation followed by a subtractive TE process, in accordance with an exemplary embodiment.

DETAILED DESCRIPTION

Figure 1A:
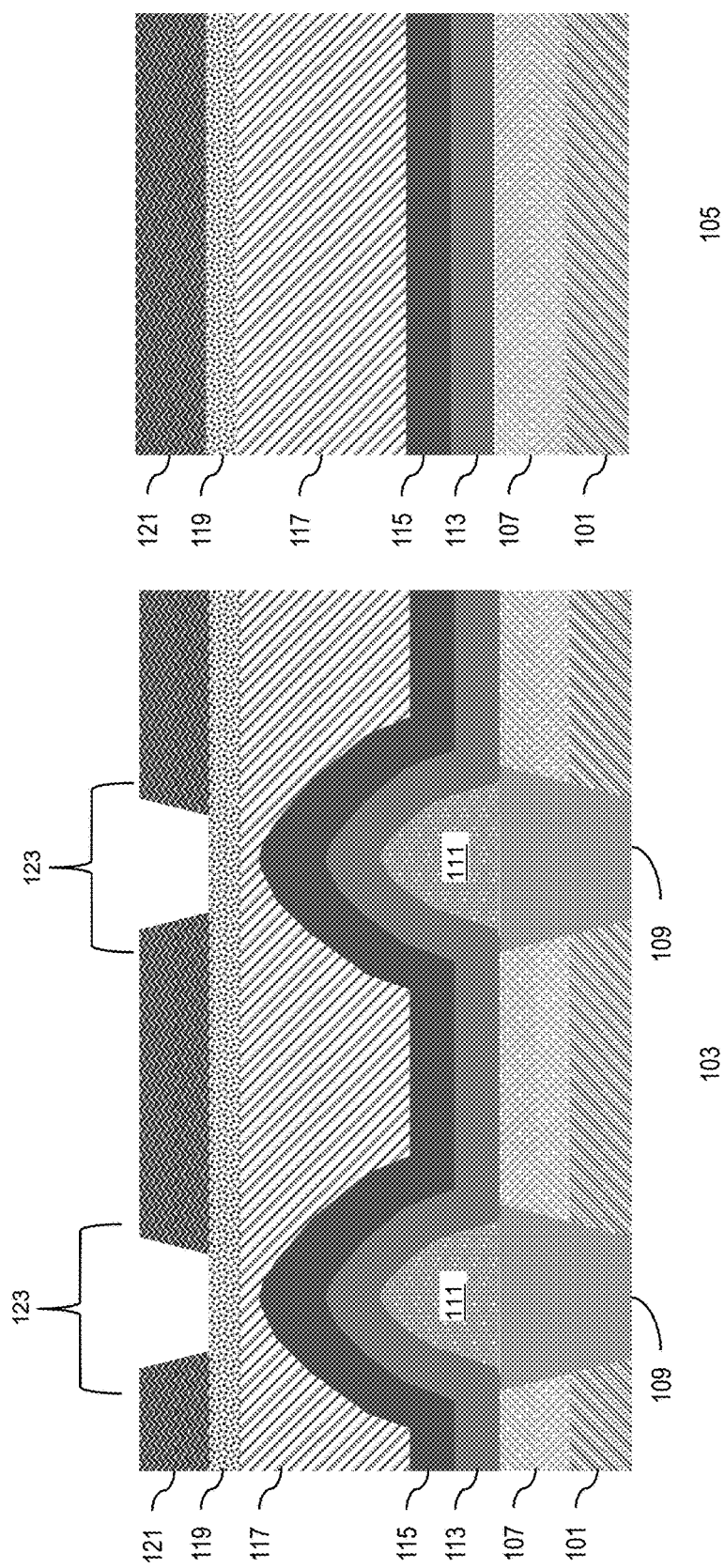
FIG. 1A through 1H schematically illustrate cross-sectional views of a process flow for forming a dome-shaped MTJ TE structure using a small via followed by a subtractive TE process, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of MTJ TE and insulator layer pinch-off and MTJ open and short concerns attendant upon forming MTJ structures with shallow and small TE. The problem is solved, inter alia, by forming a dome-shaped MTJ TE.

Methodology in accordance with embodiments of the present disclosure includes forming a MRAM stack and a logic stack of an IC structure, the MRAM stack having MTJ structures and the MRAM and logic stacks each having a SiN layer. Trenches are formed through the MRAM stack down through a portion of the SiN layer, each first trench formed above an MTJ structure. Second trenches are formed through the SiN layer of the MRAM stack, each second trench fully landed on an upper portion of each MTJ structure and the formation removing the SiN layer of the logic stack. A TaN layer is formed over the MRAM and logic stacks, and portions of the TaN layer are removed between the MTJ structures. An oxide layer is formed over the MRAM and logic stacks. Vias are formed through the oxide layer of the MRAM stack down the TaN layer above each MTJ structure and a via is formed through the logic stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIG. 1A through 1H schematically illustrate cross-sectional views of a process flow for forming a dome-shaped MTJ TE structure using a small via followed by a subtractive TE process, in accordance with an exemplary embodiment. Adverting to FIG. 1A, a passivation layer 101 is formed over an ILD (not shown for illustrative convenience). The passivation layer 101 may be formed, e.g., of NBLOK (SiCN). Thereafter, an oxide layer 107 is formed over the passivation layer 101, and lower interconnect structures 109 are formed through the oxide layer 107 and the passivation layer 101 of the memory region 103. The lower interconnect structures 109 may be formed, e.g., of copper (Cu), tungsten (W), TaN or other materials. A MTJ layer (not shown for illustrative convenience) is conformally formed over the oxide layer 107 of the memory region 103 and the lower interconnect structures 109. Then, portions of the MTJ layer are etched down to the oxide layer 107 and the lower interconnect structures 109 to form the MTJ structures 111, e.g., to a height of 50 nm to 110 nm and a width of 50 nm to 110 nm over a center portion of each lower interconnect structure 109. A SiN layer 113 is then formed, e.g., to a thickness of 10 nm to 40 nm over the oxide layer 107, portions of the lower interconnect structures 109 and the MTJ structures 111. Next, an oxide layer 115 is formed, e.g., to a thickness of 30 nm to 90 nm, over the SiN layer 113. A NFC layer 117 is then formed over the oxide layer 115. Thereafter, an LTO layer 119 is formed over the NFC layer 117. Subsequently, a photoresist 121 is formed over the LTO layer 119 and patterned. The photoresist 121 in the memory region 103 has openings 123, e.g., each with a width of 50 nm to 110 nm, directly above the MTJ structures 111. The bottom CD of each opening 123 is equal approximately to the width of the insulating layer 112 of the respective MTJ structure 111.

Figure 1B:
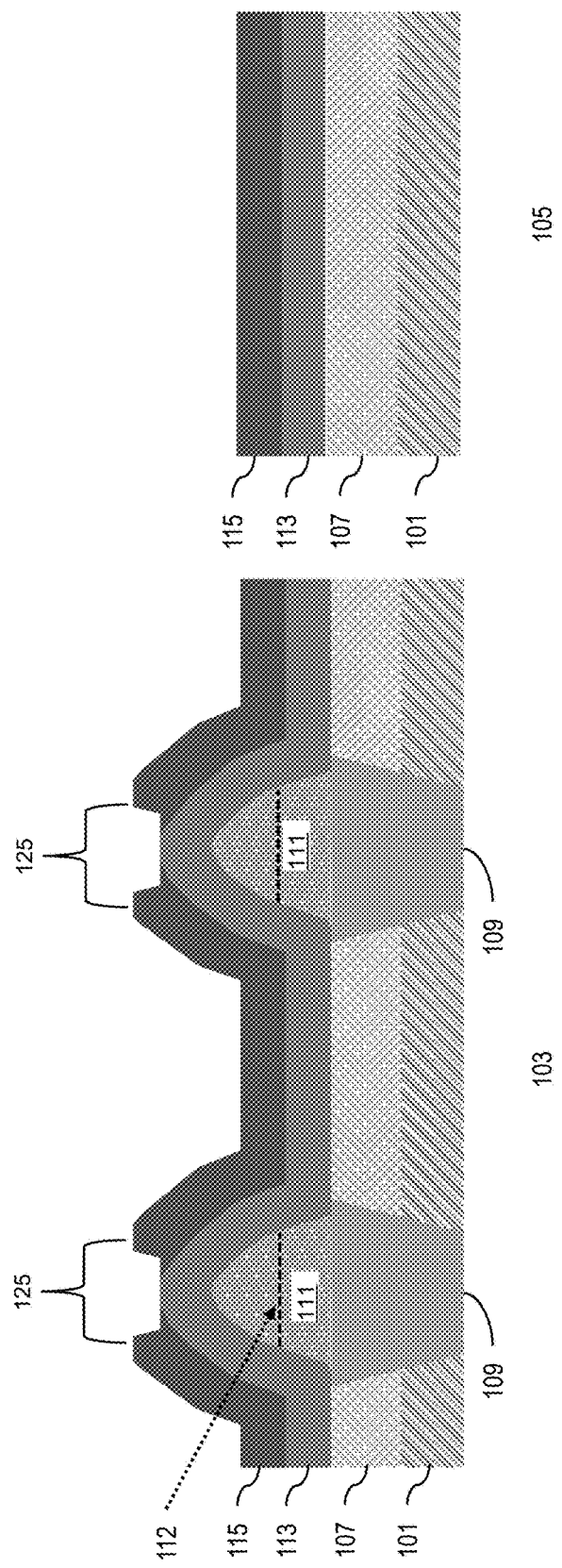

Adverting to FIG. 1B, the LTO layer 119, the NFC layer 117, the oxide layer 115 and portions of the SiN layer 113 are etched through the openings 123 to form the trenches 125. The photoresist 121, the LTO layer 119 and the NFC layer 117 are then removed.

Figure 1C:
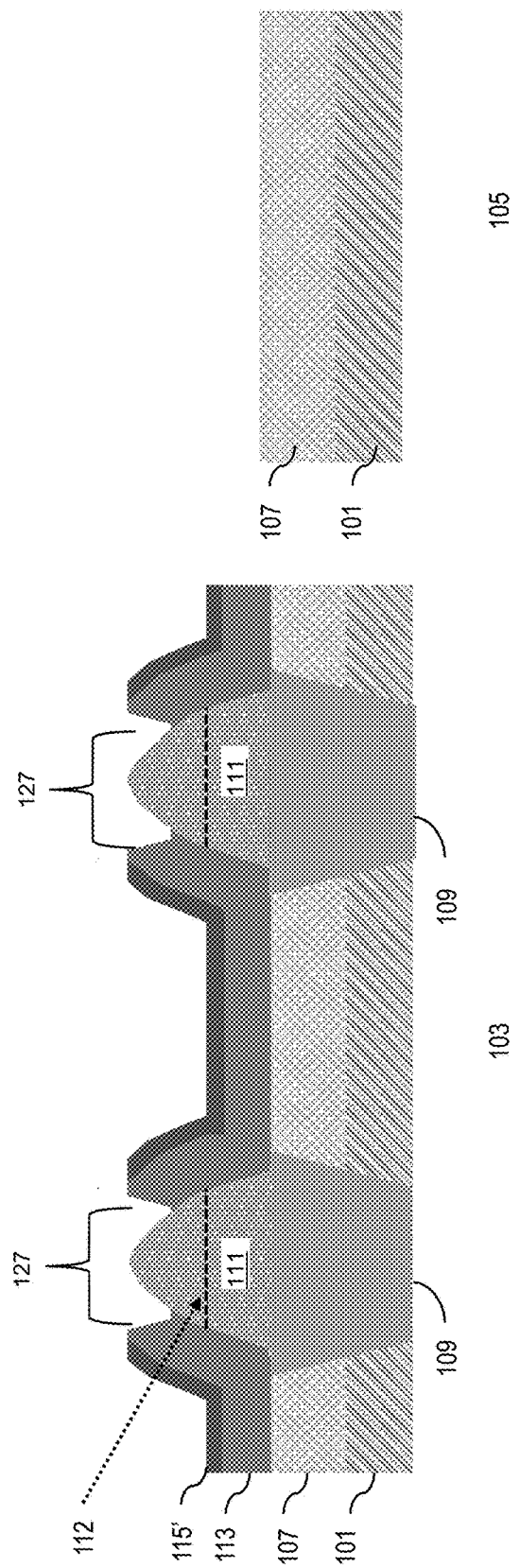

Next, trenches 127 are formed over the MTJ structures 111, respectively, by further etching the SiN layer 113 through trenches 125 until each trench 127 has a bottom CD of 30 nm to 90 nm and fully lands on an upper portion of each MTJ structure 111, as depicted in FIG. 1C. If a smaller bottom CD of the trench 127 is required, a fully-landed etch process may be used and sufficient over etch (OE) can be implemented to ensure that each trench 127 is fully landed. Alternatively, if a bigger bottom CD of the trench 127 is required, the etch time can be adjusted so that the variation will only be from the CVD film deposition and etch rate. Using either the fully-landed etch process or etch time adjustment depending on the desired bottom CD ensures enough margin between the bottom of the trench 127 and the insulator layer (represented by the line 112) of each MTJ structure 111. The etching also thins the oxide layer 115, forming the oxide layer 115' and removes the oxide layer 115 and the SiN layer 113 from the logic region 105. Removing the SiN layer 113 from the logic region 105 reduces the device capacitance and enables higher measurement accuracy (less complicated film stack). Subsequently, the oxide layer 115' and the SiN layer 113 are rinsed with deionized water (not shown for illustrative convenience) to wash away any remaining etchant residue.

Figure 1D:
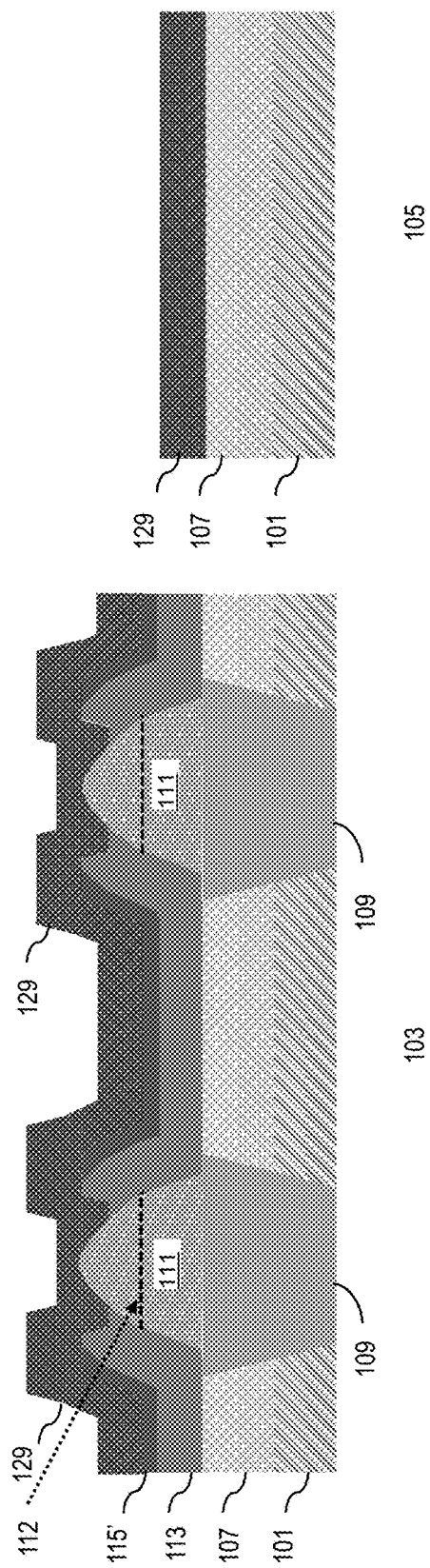
Figure 1E:
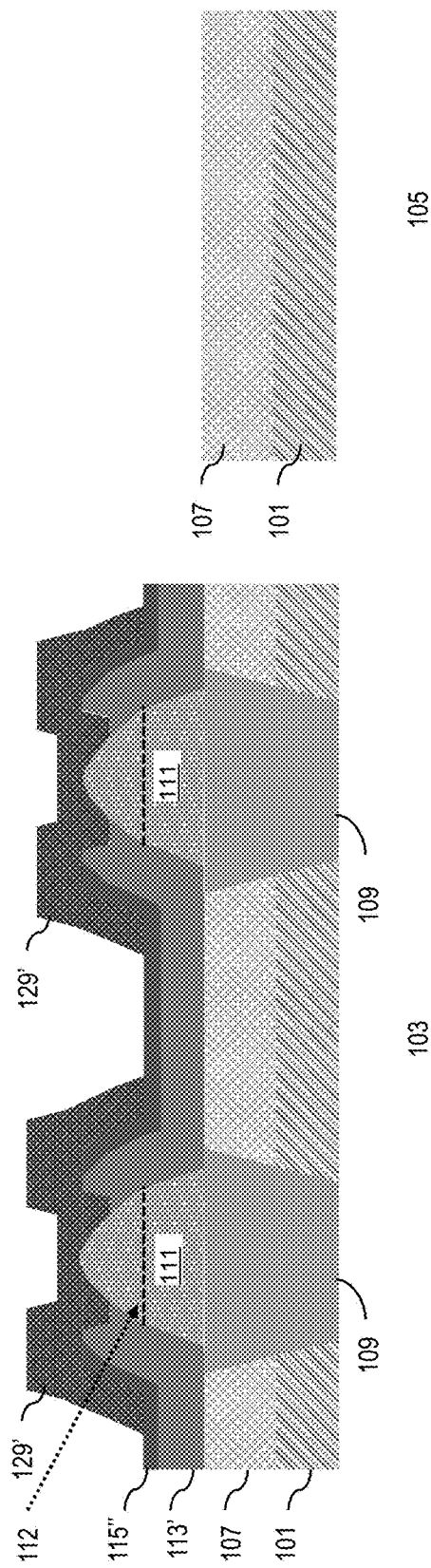
Figure 1F:
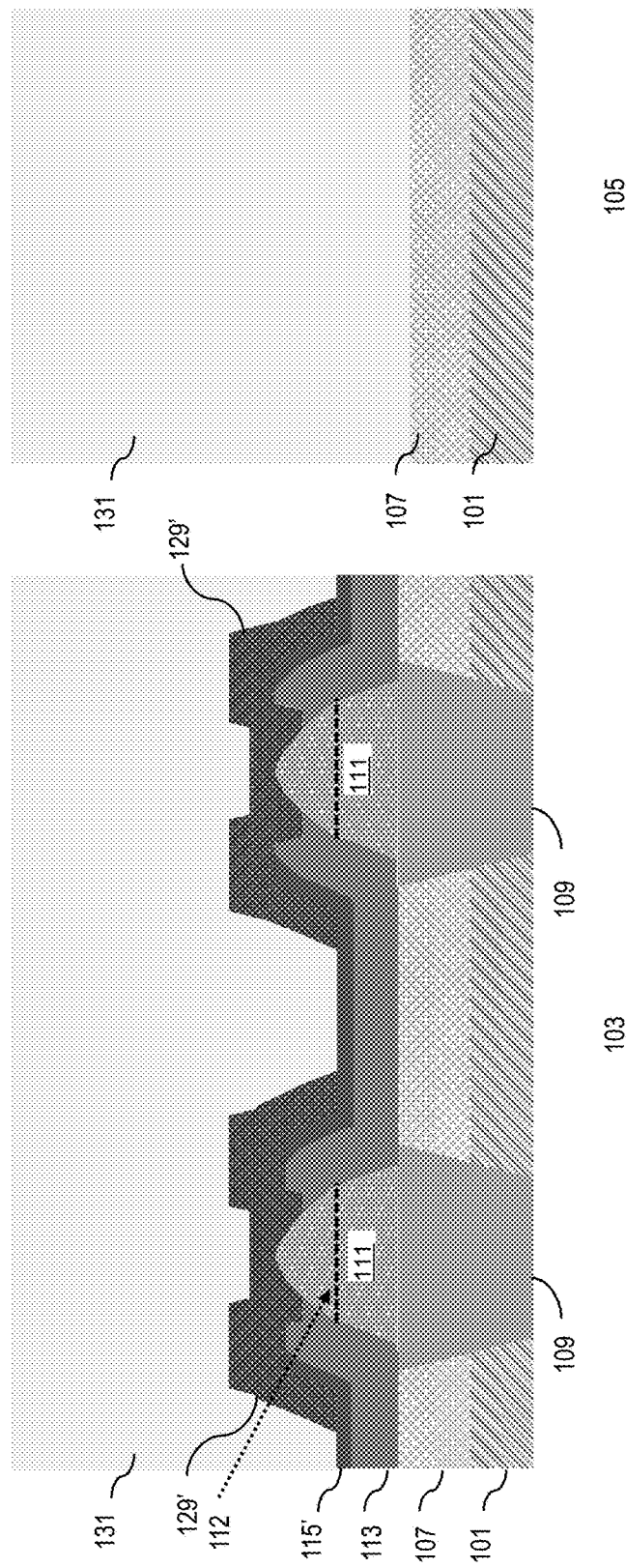
Figure 1G:
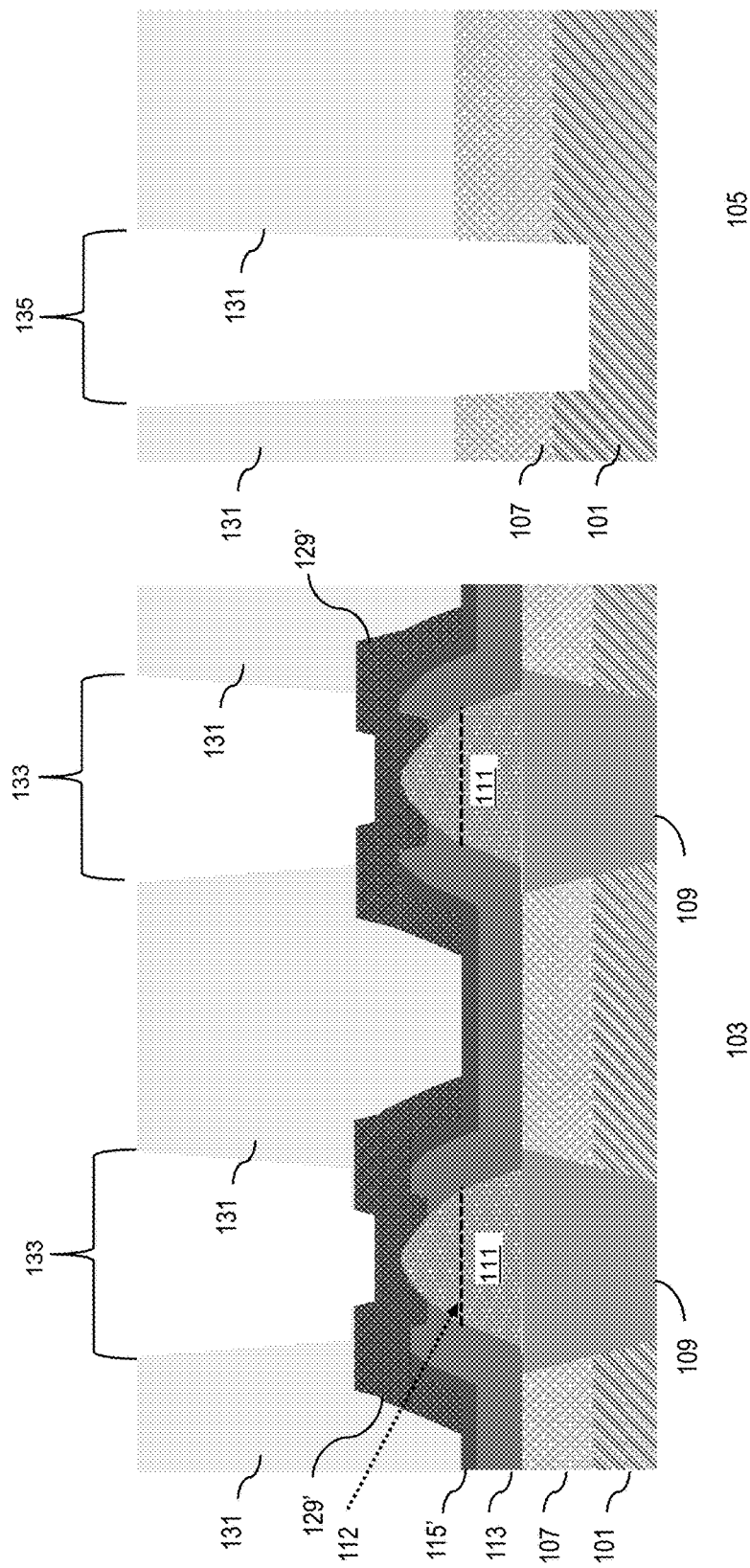

Adverting to FIG. 1D, a TaN layer 129 is formed, e.g., to a thickness of 10 nm to 40 nm, over the oxide layer 115', the SiN layer 113, and the MTJ structures 111 in the memory region 103 and over the oxide layer 107 in the logic region 105. Portions of the TaN layer 129 between the MTJ structure 111 are then etched down to the oxide layer 115', forming the dome-shaped TaN structures 129' by subtraction, as illustrated in FIG. 1F. Consequently, each TaN structure 129' has an upper CD, e.g., of 60 nm to 150 nm. The etching also removes the TaN layer 129 in the logic region 105.

Figure 1H:
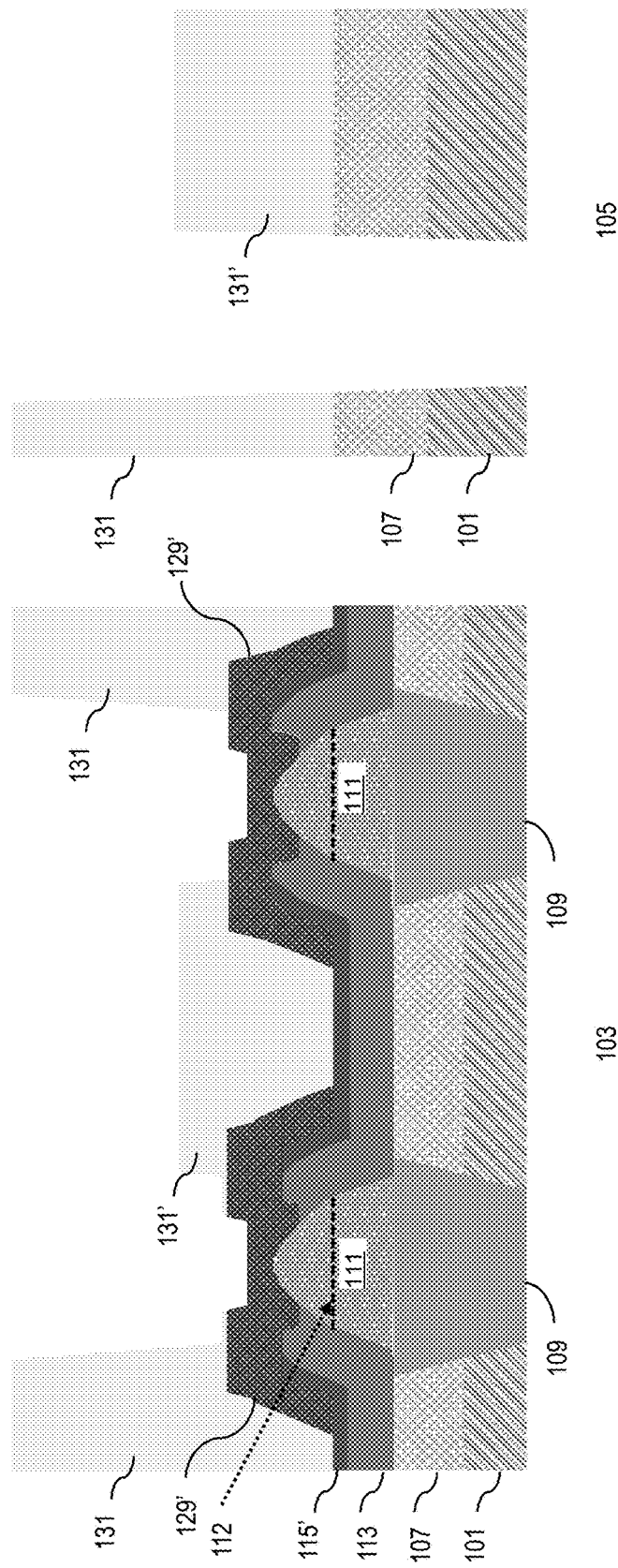

Next, an oxide layer 131 is formed over the oxide layer 115' and the dome-shaped TaN structures 129' in the memory region 103 and over the oxide layer 107 in the logic region 105, as depicted in FIG. 1F. The oxide layer 131 may be formed, e.g., of SiCOH or other similar oxide. A CMP step is followed to planarize the surface of the oxide layer 131. Adverting to FIG. 1G, vias 133 are formed through the oxide layer 131 down to the dome-shaped TaN structures 129' above each MTJ structure 111 in the memory region 103 and a via 135 is formed through the oxide layer 131 down to the passivation layer 101 of the logic region 105. A portion of the oxide layer 131 between the vias 133 in the memory region 103 and a portion adjacent to the via 135 are then removed to form a metal contact layer (not shown for illustrative convenience), providing electrical signal conducting path in both the memory and logic regions 103 and 105, respectively, as depicted in FIG. 1H.

FIG. 2A through 2F schematically illustrate cross-sectional views of a process flow for forming dome-shaped MTJ TE structure using a spacer encapsulation followed by a subtractive TE process, in accordance with an exemplary embodiment. Adverting to FIG. 2A, a passivation layer 201 is formed over an ILD (not shown for illustrative convenience). The passivation layer 201 may be formed, e.g., of NBLOK (SiCN). Thereafter, an oxide layer 207 is formed over the passivation layer 201, and a laterally separated lower interconnect structures 209 are formed through the oxide layer 207 and the passivation layer 201 of the memory region 203. The lower interconnect structures 209 may be formed, e.g., of Cu, W, TaN or other similar materials. A MTJ layer (not shown for illustrative convenience) is conformally formed over the oxide layer 207 of the memory region 203 and the lower interconnect structures 209. Then, portions of the MTJ layer are etched down to the oxide layer 207 and the lower interconnect structures 209 to form MTJ structures 211 with a relatively straight profile, e.g., with a height of 50 nm to 110 nm and a width of 50 nm to 110 nm, each MTJ structure 211 formed over a center portion of a lower interconnect structure 209. A SiN layer 213 is then formed, e.g., to a thickness of 10 nm to 40 nm, over the oxide layer 207, portions of the lower interconnect structures 209 and the MTJ structures 211.

Figure 2B:
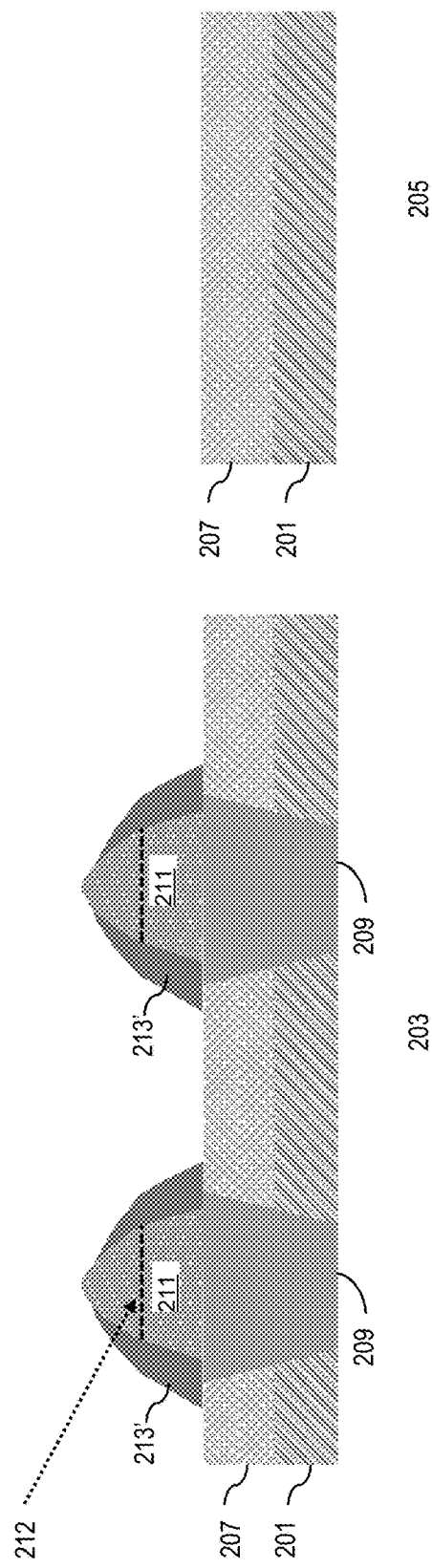
Figure 2C:
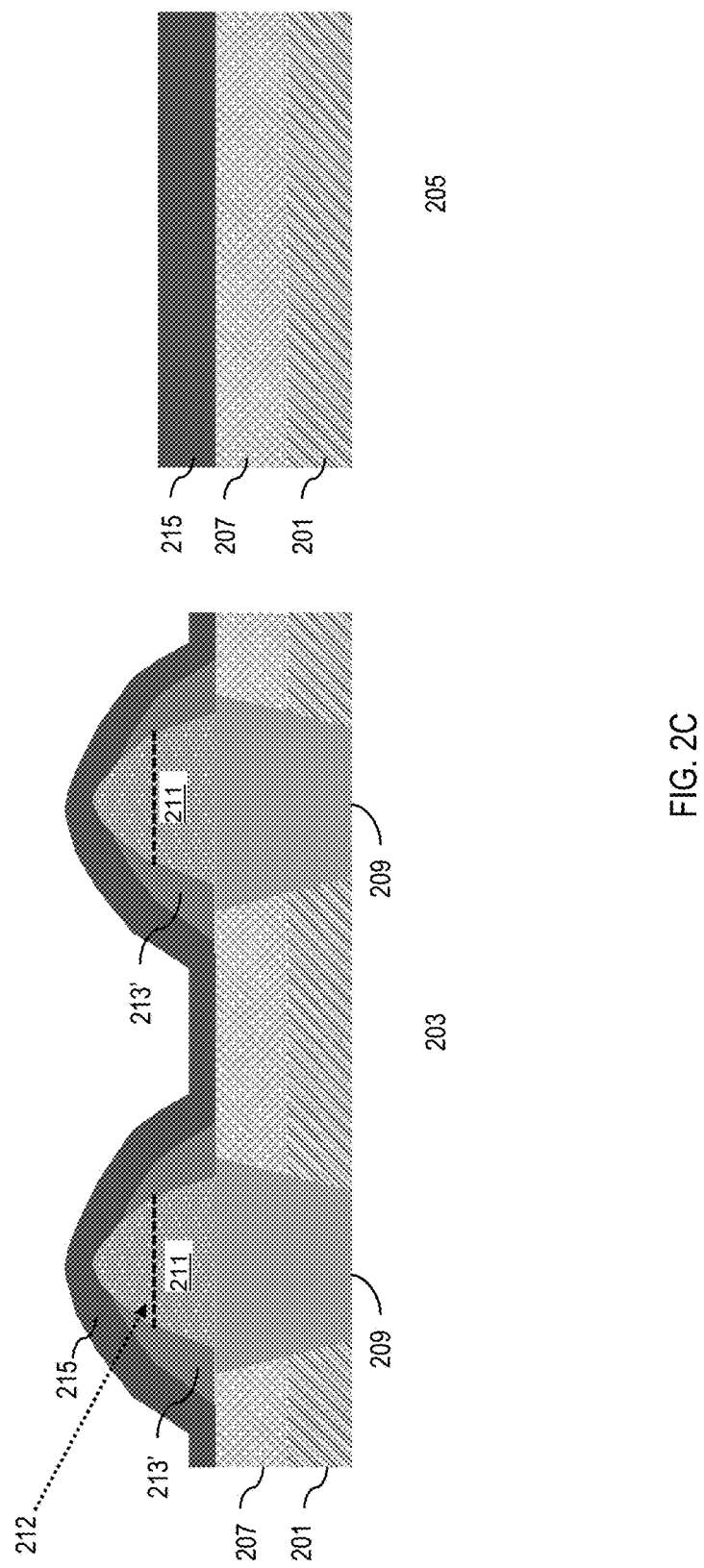
Figure 2D:
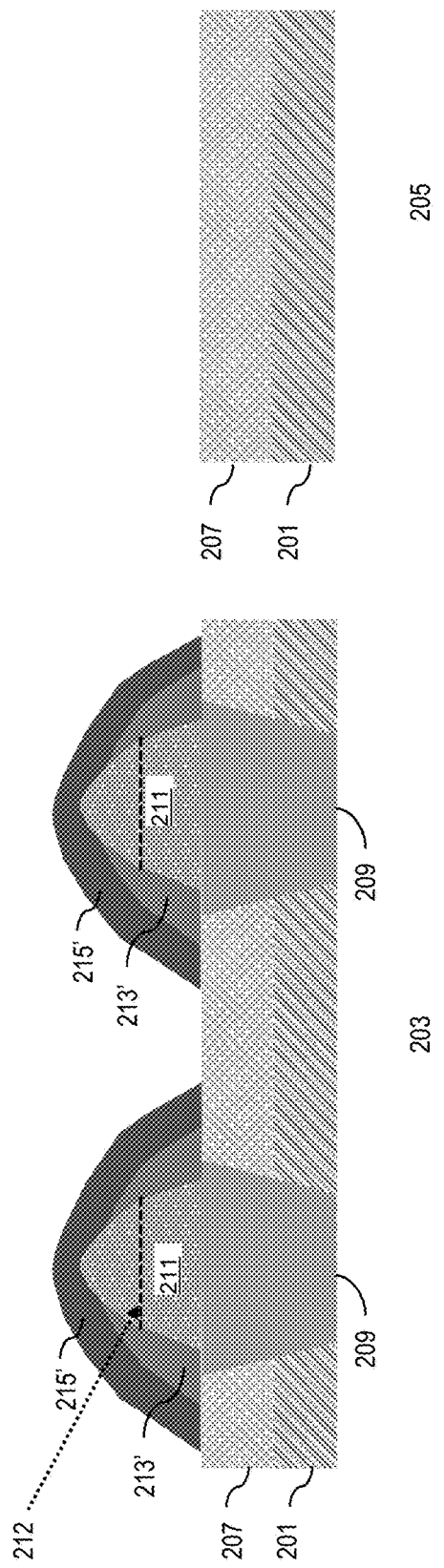

Adverting to FIG. 2B, the SiN layer 213 is etched, e.g., by a blanket etch, on opposite sides of each MTJ structure 211 and therebetween in the memory region 203 to expose just the top portion of the MTJ structures 211, forming the SiN spacers 213' around each MTJ structure 211. The top portion of each resulting SiN spacer 213' is tapered and the bottom portion may have a width, e.g., of 10 nm to 40 nm. In particular, the blanket etch process is controlled to avoid exposing the insulator layer (represented by the line 212) of the MTJ structures 211. The blanket etch process also removes the SiN layer 213 in the logic region 205, which as discussed with respect to FIG. 1C, reduces the device capacitance and enables higher measurement accuracy (less complicated film stack). Next, in FIG. 2C, a TaN layer 215 is conformally formed, e.g., to a thickness of 10 nm to 40 nm, over portions of the oxide layer 207, SiN spacers 213' and the MTJ structures 211 in the memory region 203, and over the oxide layer 207 in the logic region 205. Further, an optional SiN layer or an oxide hard mask (HM) layer (not shown for illustrative convenience) may be formed before resist coating. Thereafter, in FIG. 2D, portions of the TaN layer 215 are etched between the MTJ structure 211, forming the dome-shaped TaN structures 215' in the memory region 203 and removing the TaN layer 215 in the logic region 205.

Figure 2E:
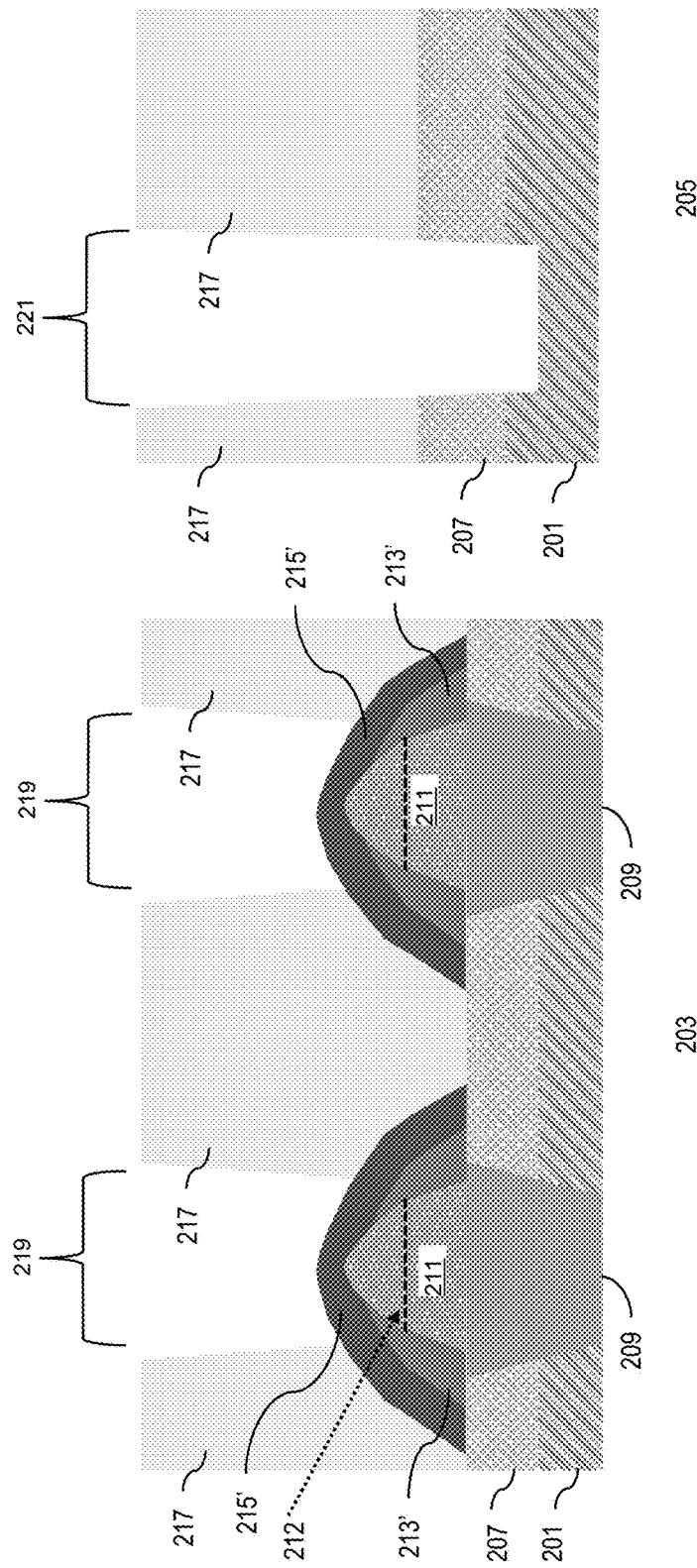
Figure 2F:
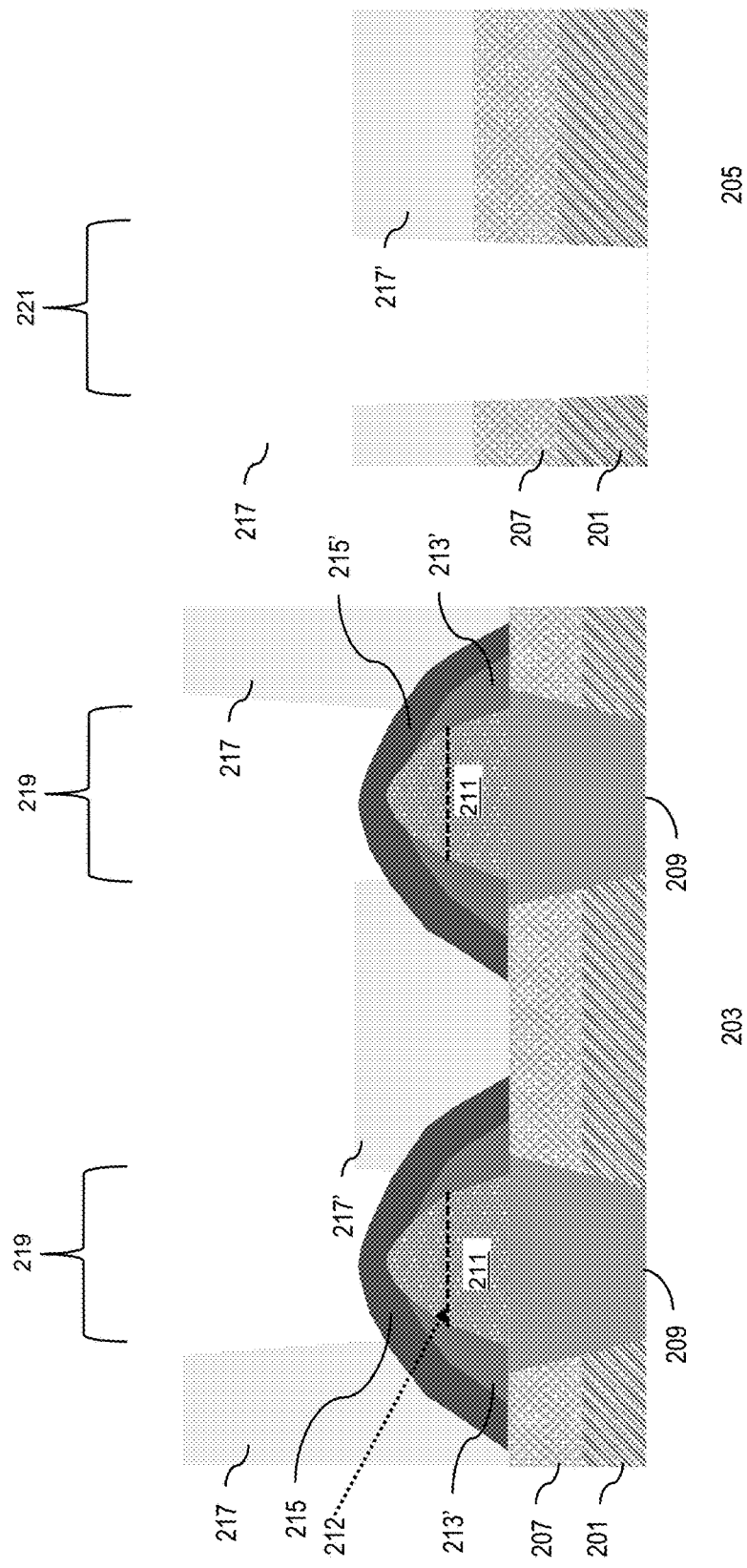

Next, an oxide layer 217 is formed over the oxide layer 207 and the dome-shaped TaN structures 215'. A planarization process is applied before via opening, e.g., by CMP. Then, vias 219, each centered above a MTJ structure 211, are formed through the oxide layer 217 down to the dome-shaped TaN structures 215' in the memory region 203, as depicted in FIG. 2E. At the same time, a via 221 is formed through the oxide layer 217 of the logic region 205 down through a portion of the passivation layer 201. The oxide layer 217 may be formed, e.g., of SiCOH or a similar oxide. Adverting to FIG. 2F, a portion of the oxide layer 217 in the memory region 203 and a portion of the oxide layer 217 in the logic region 205 are removed at trench etch step, typically by a conventional dry plasma etch. The vias 219 and 221 and trenches are then filled with conducting interconnect materials, such as Cu, W, etc. The Cu interconnect can be a conventional dual damascene process, the process steps include barrier deposition, seed deposition, Cu electrochemical plating (ECP), Cu anneal and CMP.

The embodiments of the present disclosure can achieve several technical effects, such as solving top connection challenges including open MTJ concerns by using a fully landed etch process to center the domed-shaped dome-shaped TE structure over each MTJ structure with sufficient OE and including MTJ short since the sidewall SiN layer is not attacked during subsequent processes. In addition, the present method is cost effective because there is no post MTJ planarization (CMP) where a very good process control is required and normally needs a few passes and because the subtractive TE etching process is cheaper than a dual damascene process with one CMP step being saved. Further, as discussed above, removing the SiN layer in the logic region results in lower capacitance and higher measurement accuracy (less complicated film stack). Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices having MRAM structures.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a magnetic random access memory (MRAM) stack and a logic stack of an integrated circuit (IC) structure, the MRAM stack having a laterally separated magnetic tunnel junction (MTJ) structures and the MRAM and logic stacks each having a silicon nitride (SiN) layer;
   forming first trenches through the MRAM stack down through a portion of the SiN layer, each first trench formed above an MTJ structure;
   forming second trenches through the SiN layer of the MRAM stack, the second trenches fully landed on an upper portion of the MTJ structures and the formation removing the SiN layer of the logic stack;
   forming a tantalum nitride (TaN) layer over the MRAM and logic stacks;
   removing portions of the TaN layer on opposite sides of the MTJ structures and therebetween;
   forming an oxide layer over the MRAM and logic stacks; and
   forming vias through the oxide layer of the MRAM stack down the TaN layer above each MTJ structure and a via through the logic stack.

2. A method according to claim 1, comprising forming the MRAM and logic stacks by:
   forming the passivation layer over an interlayer dielectric (ILD) of the IC structure;
   forming a trench through the passivation layer down to the ILD, the trench forming a MRAM region and a logic region;
   forming a first oxide layer over the passivation layer;
   forming lower interconnect structures laterally separated through the first oxide and passivation layers of the MRAM region;
   forming a MTJ layer over the first oxide layer of the MRAM region and the lower interconnect structures;
   etching the MTJ layer down to the first oxide layer and lower interconnect structures, the etching forming a MTJ structure over a center portion of each lower interconnect;
   forming the SiN layer over the first oxide layer and the MTJ structures;
   forming a second oxide layer over the SiN layer;
   forming a near-frictionless carbon (NFC) layer over the second oxide layer;
   forming a low temperature oxide (LTO) layer over the NFC layer; and
   forming a photoresist layer over the LTO.

3. A method according to claim 2, comprising forming the SiN layer to a thickness of 10 nanometer (nm) to 40 nm.

4. A method according to claim 2, comprising forming the first trenches by:
   forming a trench with a bottom critical dimension (CD) of 50 nm to 110 nm through the photoresist layer above each MTJ structure; and
   etching the LTO, NFC, second oxide, and a portion of the SiN layers through each trench.

5. A method according to claim 2, comprising forming the second trenches by:
   stripping the photoresist, LTO, and NFC layers; and
   etching the SiN layer until each second trench has a bottom CD of 30 nm to 90 nm, the etching removing the second oxide layer from the logic stack.

6. A method according to claim 5, wherein the etching of the SiN layer comprises a fully-landed etch process or a chemical vapor deposition (CVD) film deposition and etch process.

7. A method according to claim 2, comprising forming each dome-shaped TaN layer by:
   forming the TaN layer to a thickness of 10 nm to 40 nm over the MRAM and logic stacks; and
   etching portions of the TaN layer down to the second oxide layer on opposite sides of each MTJ structure and therebetween with lithography, and consecutively removing the TaN layer from over the logic stack.

8. A method according to claim 1, further comprising dielectric deposition, planarization and interconnect formation in both the MRAM and logic regions.

9. A device comprising:
   a passivation layer over an interlayer dielectric (ILD) of a magnetic random access memory (MRAM) region and a logic region of an integrated circuit (IC) structure, the MRAM and logic regions laterally separated;
   a first oxide layer over the passivation layer;
   lower interconnect structures laterally separated through the first oxide and passivation layers of the MRAM region;
   magnetic tunnel junction (MTJ) structures laterally separated, each MTJ structure over a center portion of a lower interconnect;
   silicon nitride (SiN) spacers formed around each MTJ structure;

a domed-shaped tantalum nitride (TaN) layer over each MTJ structure, the domed-shaped TaN layers laterally separated;

a second oxide layer over the MRAM and logic regions;

a via through the second oxide layer down to the domed-shaped TaN layer over each MTJ structure; and a via through the logic region down to the ILD.

10. A device according to claim 9, wherein the TaN layer comprises a thickness of 10 nanometer (nm) to 40 nm.

11. A device according to claim 9, wherein the second oxide layer comprises a thickness of 30 nm to 90 nm.

12. A device according to claim 11, wherein each SiN spacer comprises a horizontal portion over the first oxide layer and a portion of a lower interconnect structure and the portions over the first oxide layer between the MTJ structures are contiguous.

13. A device according to claim 11, wherein each SiN spacer comprises a thickness of 10 nm to 40 nm.

14. A device according to claim 11, wherein each domed-shaped TaN layer has an upper critical dimension (CD) of 60 nm to 150 nm.

15. A device according to claim 11, wherein a contact area between each domed-shaped TaN layer and the MTJ structure has a CD of 30 nm to 90 nm.

16. A device according to claim 9, wherein each SiN spacer has a lower portion with a width of 10 nm to 40 nm and a tapered upper portion.

17. A method comprising:

forming a magnetic random access memory (MRAM) stack and a logic stack of an integrated circuit (IC) structure, the MRAM stack having magnetic tunnel junction (MTJ) structures and the MRAM and logic stacks each having a silicon nitride (SiN) layer;

etching the SiN layer of the logic stack and portions of the SiN layer of the MRAM stack, the etching forming SiN spacers around each MTJ structure;

forming a conformal tantalum nitride (TaN) layer over the MRAM and logic stacks;

removing the TaN layer over the logic stack and portions of the TaN layer between the MTJ structures and leaving the TaN layer covering the MTJ structures un-etched;

forming an oxide layer over the MRAM and logic regions;

forming a via through the oxide layer down to the TaN layer above each MTJ structure and through the logic stack; and planarizing the oxide layer prior to forming a metal contact layer over the MRAM and logic stacks.

18. A method according to claim 17, comprising forming the MRAM and logic stacks by:

forming a passivation layer over an interlayer dielectric (ILD) on the IC structure;

forming a trench through the passivation layer down to the ILD, the trench forming a MRAM region and a logic region;

forming a first oxide layer over the passivation layer;

forming a lower interconnect structures laterally separated through the first oxide and passivation layers of the MRAM region;

forming a MTJ layer over the lower interconnect structures and the first oxide layer of the MRAM region;

etching the MTJ layer down to the first oxide layer and lower interconnect structures, the etching forming a MTJ structure over a center portion of each lower interconnect; and forming the SiN layer over the first oxide layer and the MTJ structures.

19. A method according to claim 17, comprising forming the SiN layer to a thickness of 10 nanometer (nm) to 40 nm.

20. A method according to claim 17, comprising forming the TaN layer to a thickness of 10 nm to 40 nm.

* * * * *